United States Patent [19]

Akinaga

[11] Patent Number: 4,724,399
[45] Date of Patent: Feb. 9, 1988

[54] CIRCUIT ARRANGEMENT COMPRISING AN ISOLATOR INTEGRAL WITH AN ADMITTANCE ELEMENT

[75] Inventor: Wakoto Akinaga, Tokyo, Japan
[73] Assignee: NEC Corporation, Tokyo, Japan
[21] Appl. No.: 831,087
[22] Filed: Feb. 20, 1986

Related U.S. Application Data

[63] Continuation of Ser. No. 615,493, May 30, 1984, abandoned.

[30] Foreign Application Priority Data

May 30, 1983 [JP] Japan .................................. 58-95561

[51] Int. Cl.$^4$ .............................................. H03F 3/60
[52] U.S. Cl. ...................................... 330/286; 330/53
[58] Field of Search ................. 330/53, 277, 286, 287; 333/1.1, 24.2

[56] References Cited

U.S. PATENT DOCUMENTS 3,651,430 3/1972 Ito et al. ............................... 333/1.1
3,673,518 6/1972 Carr ..................................... 333/1.1
3,930,206 12/1975 Rosen et al. ......................... 330/287

FOREIGN PATENT DOCUMENTS 0127712 10/1980 Japan .................................... 330/286

Primary Examiner—Eugene R. LaRoche
Assistant Examiner—Steven J. Mottola
Attorney, Agent, or Firm—Sughrue, Mion, Zinn, Macpeak and Seas

[57] ABSTRACT

In a circuit arrangement comprising a three port isolator (21) which has input, output, and dummy ports (33, 22, and 23), an admittance element (41 to 43) is connected at a position or positions selected between the input and the output ports, between the output and the dummy ports, and between the dummy and the input ports. When the isolator comprises a strip line conductor having branches connected to the input, the output, and the dummy ports, the admittance element may be an extension or extensions of the branches. The output port is connected to an amplifier (14) directly or through an inductance element (34). The connection of the admittance element makes it unnecessary to connect a matching circuit which is otherwise essential between the isolator and the amplifier.

7 Claims, 5 Drawing Figures

4,724,399

CIRCUIT ARRANGEMENT COMPRISING AN ISOLATOR INTEGRAL WITH AN ADMITTANCE ELEMENT

This is a continuation of application Ser. No. 615,493, filed 5/30/84 now abandoned.

BACKGROUND OF THE INVENTION

This invention relates to a circuit arrangement for use in combination with an amplifier for amplifying an input signal sent from a satellite or the like.

An amplifier of the type described comprises an active element, such as a field effect transistor or the like, and an input circuit, namely, a circuit arrangement for delivering an input signal to the active element. Inasmuch as the amplifier is supplied with an extremely weak radio wave from a satellite, generation of noise should be reduced in the amplifier per se as low as possible. Effective reduction of the noise in the amplifier is possible by lowering loss in the circuit arrangement, as known in the art.

For this purpose, an isolator is used in the circuit arrangement. A matching circuit should, however, be connected between the isolator and the active element to match impedances between the isolator and the active element. The amplifier therefore is disadvantageous in that the noise characteristic is inevitably degraded by connection of the matching circuit. In addition, connection of the matching circuit makes the amplifier bulky.

SUMMARY OF THE INVENTION

It is an object of this invention to provide a circuit arrangement which is combined with an amplifier and is capable of avoiding a reduction of a noise characteristic.

It is another object of this invention to provide a circuit arrangement of the type described, which is adjustable to an optimum admittance.

It is a further object of this invention to provide a circuit arrangement of the type described, which is simple and compact in structure.

A circuit arrangement to which this invention is applicable is responsive to an input signal and supplies an output signal to an amplifier. The circuit arrangement comprises an isolator having an input port for the input signal, an output port for the output signal, and a dummy port connected to a dummy load. According to this invention, the circuit arrangement comprises an admittance element connected to the isolator at a position selected between the input and the output ports, between the output and the dummy ports, and between the dummy and the input ports.

DESCRIPTION OF THE PREFERRED EMBODIMENTS

Figure 1:
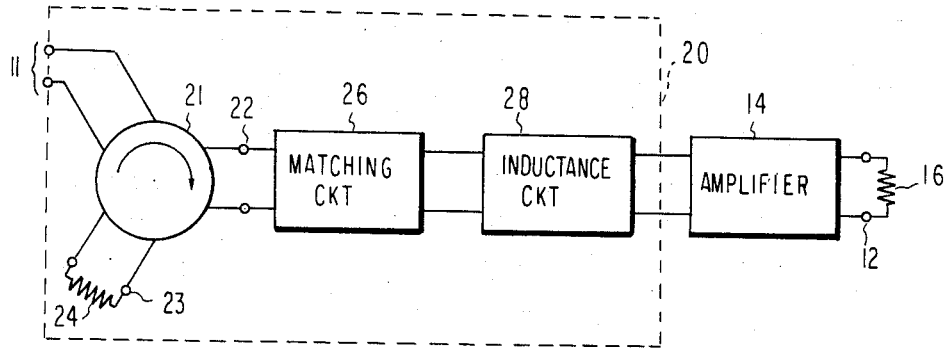
FIG. 1 shows a block diagram of a conventional amplification device.

Referring to FIG. 1, description will be made as regards a conventional amplification device for a better understanding of this invention. The illustrated amplification device comprises input and output terminal pairs 11 and 12 each of which will collectively be called input and output terminals, respectively, for simplicity of description. The input terminal 11 is supplied with an input signal. The input signal is delivered from an antenna (not shown) directed towards a satellite and falls within a frequency band, for example, between 3.7 and 4.2 GHz. An amplifier 14 is connected to the output terminal 12 and has an active element, such as a field effect transistor or the like. A load 16 is connected to the output terminal 16 and is specified by an admittance in this figure.

A circuit arrangement 20 is connected between the input terminal 11 and the amplifier and operable as an input circuit for delivering the input signal to the amplifier 14 as an output signal. The circuit arrangement 20 comprises a three port isolator 21 having an input port, an output port 22, and a dummy port 23. The input port is connected to the input terminal 11 while the dummy port 23 is connected to a dummy load 24.

The isolator 21 serves to unidirectionally deliver the input signal from the input port to the output port 22 without reflection and to reduce loss of the circuit arrangement 20. This means that a noise figure of the circuit arrangement is improved by connection of the isolator 21. More specifically, the isolator 21 has an admittance which may be called a source admittance, when seen from the output port 22. An optimum noise figure is achieved by adjusting the source admittance to an optimum admittance which can be calculated in a known manner.

However, the source admittance is different from that input admittance of the amplifier 14 which is determined by the active element. A matching circuit 26 and an inductance circuit 28 are interposed between the isolator 21 and the amplifier 14 to match the admittance between the isolator 21 and the amplifier 14. The matching circuit 26 mainly serves to match a susceptance component between the isolator 21 and the amplifier 14 rather than a conductive component therebetween. Inasmuch as the matching circuit 26 comprises a conductor which is equal, for example, to an integral multiple of a quarter of a wavelength and which is inevitably accompanied by the conductance component, connection of the matching circuit 20 objectionably increases the loss of the circuit arrangement 20 and results in degradation of the noise figure in the circuit arrangement 20, as mentioned in conjunction with the preamble of the instant specification.

Figure 2:
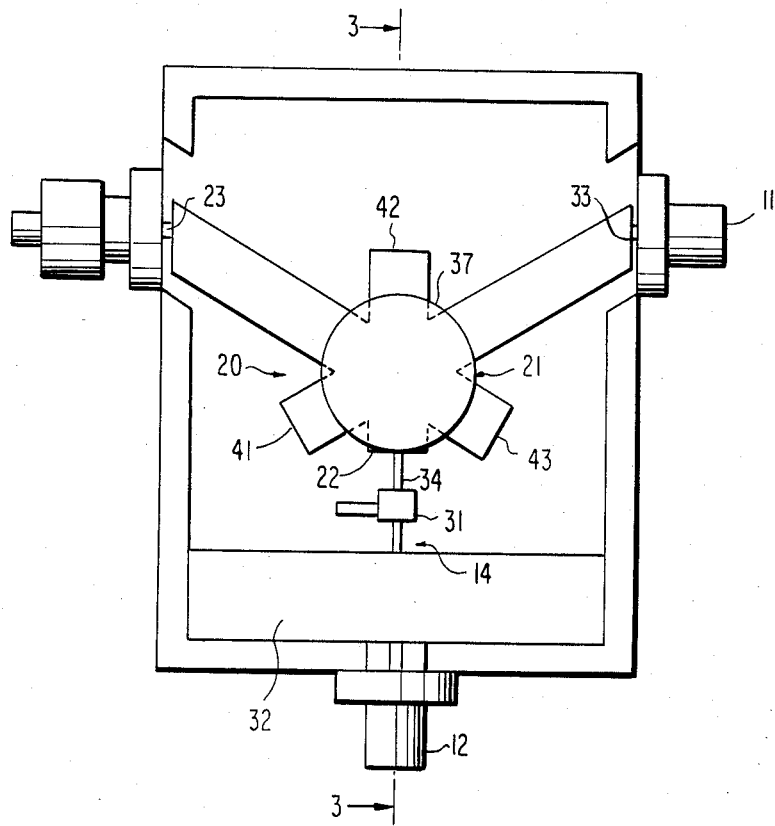
FIG. 2 shows a top view of an amplification device comprising a circuit arrangement according to a preferred embodiment of this invention, with a housing partially removed therefrom.
Figure 3:
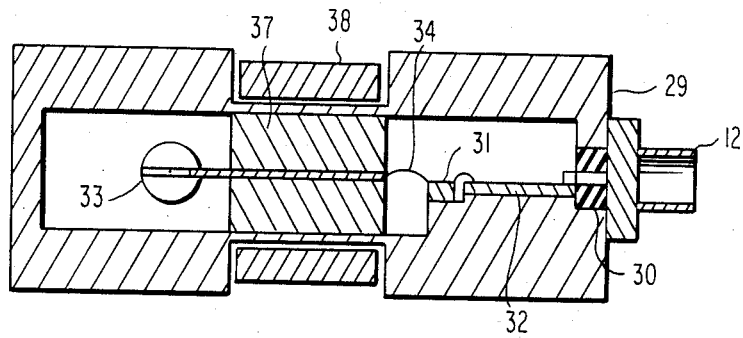
FIG. 3 shows a sectional view taken on a line 3—3 of FIG. 2.

Referring to FIGS. 2 and 3, an amplification device comprises a circuit arrangement 20 according to a preferred embodiment of this invention and an amplifier 14 connected to the circuit arrangement 20. As shown in FIG. 3, the amplification device is accommodated in a conductive housing 29. The housing 29 is usually grounded and serves as a part of a Triplate strip line, as will become clear as the description proceeds. The amplification device comprises the input and the output terminals 11 and 12 each of which is electrically insulated from the housing 29 by an insulator 30 as shown in FIG. 3.

The illustrated amplifier 20 comprises a field effect transistor 31 and an output circuit 32 connected between the field effect transistor 31 and the output terminal 12. The output circuit 32 may be an output matching circuit.

In FIGS. 2 and 3, the circuit arrangement 20 comprises a three port isolator 21 comprising an input port depicted at 33, an output port 22, and a dummy port 23, like in FIG. 1. The input port 33, the output port 22, and the dummy port 23 are azimuthally equally spaced apart from one another, as illustrated in FIG. 2. The input port 33 is connected to the input terminal 11 while the dummy port 23 is connected to a dummy load (not shown in FIGS. 2 and 3). The output port 22 is connected to a predetermined electrode of the field effect transistor 31 through an inductance element 34. The predetermined electrode may be a gate electrode. The inductance element 34 is similar to the inductance circuit 28 illustrated in FIG. 1 and much shorter than the conductor included in the matching circuit 26 illustrated in FIG. 1. Thus, it is to be noted here that the illustrated amplification circuit does not comprise any matching circuit between the circuit arrangement 20 and the amplifier 14 and is therefore compact in structure as compared with that illustrated in FIG. 1.

The illustrated isolator 21 further comprises a strip line conductor comprising three coplanar branches. The branches are extended between a center portion of the strip line conductor and each of the input, the output, and the dummy ports 33, 22, and 23 to be combined together at the center portion of the strip line conductor.

The center portion of the strip line conductor is interposed between a pair of ferrimagnetic pieces 37 with the center portion brought into contact with the ferrimagnetic pieces 37, as shown in FIG. 3. Each of the ferrimagnetic pieces 37 has a cylindrical side surface. A magnetic field is impressed perpendicular to the ferrimagnetic pieces 37 by a pair of permanent magnets 38 located outside the housing 30. As a result, an input signal supplied from the input terminal 11 is unidirectionally circulated to the output port 22 and, thereafter, to the dummy port 23. The input signal circulated to the output port 22 is supplied as an output signal through the inductance element 34 to the field effect transistor 31. If the dummy port 23 is terminated by the dummy load 24 as illustrated in FIG. 1, a reflected wave resulting from the field effect transistor 31 is absorbed by the dummy load 24, as known in the art.

In FIGS. 2 and 3, it should be noted here that the branches have extensions 41, 42, and 43 which are extended away from the input, the output, and the dummy ports 33, 22, and 23, respectively, and which are integral with the strip line conductor. As a result, the extensions 41 through 43 are placed between the output port 22 and the dummy port 23, between the dummy port 23 and the input port 33, and between the input port 33 and the output port 22, respectively. The illustrated extensions 41 through 43 are extended outside each cylindrical side surface of the ferrimagnetic pieces 37 and serve as an admittances element. The admittance of the extensions 41 through 43 can be approximately specified by susceptances $B_1$, $B_2$, and $B_3$ because each extension 41 through 43 is very short.

With this structure, at least one of the susceptances of the extensions 41 through 43 can be controlled by the use of a pin, a bolt, or the like (not shown) attached to the extension to be controlled. Anyway, it is possible to adjust the admittance of the circuit arrangement 20 to the optimum admittance described with reference to FIG. 1. The circuit arrangement can therefore have an optimum noise figure. In addition, the extensions 41 through 43 are operable to match the admittance of the circuit arrangement with the admittance of the field effect transistor 31, as is the case with the matching circuit 26 illustrated in FIG. 1. This means that the admittance of the circuit arrangement 20 can be adjusted to that of the amplifier 14 in cooperation with the inductance element 34. Thus, connection of the admittance element to the isolator 21 makes the matching circuit 26 unnecessary between the output port 22 and the inductance element 34.

Practically, the amplification circuit can effectively be operated in a frequency band between 3.7 GHz and 4.2 GHz. In this event, the strip line conductor is 0.2 mm thick and 5 mm wide while each extension is 6.5 mm long and 5 mm wide. Each of the ferrimagnetic pieces 37 has a diameter of 13 mm while each magnet has a diameter of 19 mm.

Figure 4:
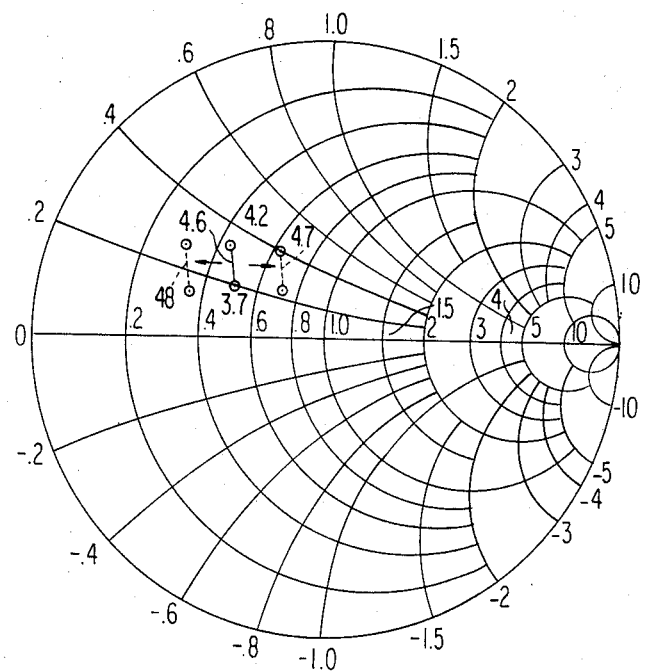
FIG. 4 shows a Smith chart for use in describing admittances of the circuit arrangement illustrated in FIGS. 2 and 3.

Referring to FIG. 4, a locus 46 shows the admittance at the output port 22 of the isolator 21 (FIGS. 2 and 3) in the frequency band between 3.7 GHz and 4.2 GHz. The admittance is substantially coincident with the admittance of the field effect transistor 31 (FIGS. 2 and 3). Thus, the circuit arrangement 20 illustrated in FIGS. 2 and 3 enables the admittance to coincide with the optimum admittance and to match the admittance of the field effect transistor 31.

When the field effect transistor 31 is changed from one to another, it is possible to change the admittance of the circuit arrangement 20 as shown at broken lines 47 and 48 in FIG. 4 by controlling at least one of the admittances of the extensions 41 through 43. Such control can be possible by adjusting each of the pin or pins. As a result, the admittance of the isolator 21 can be varied in accordance with a characteristic of each field effect transistor.

Figure 5:
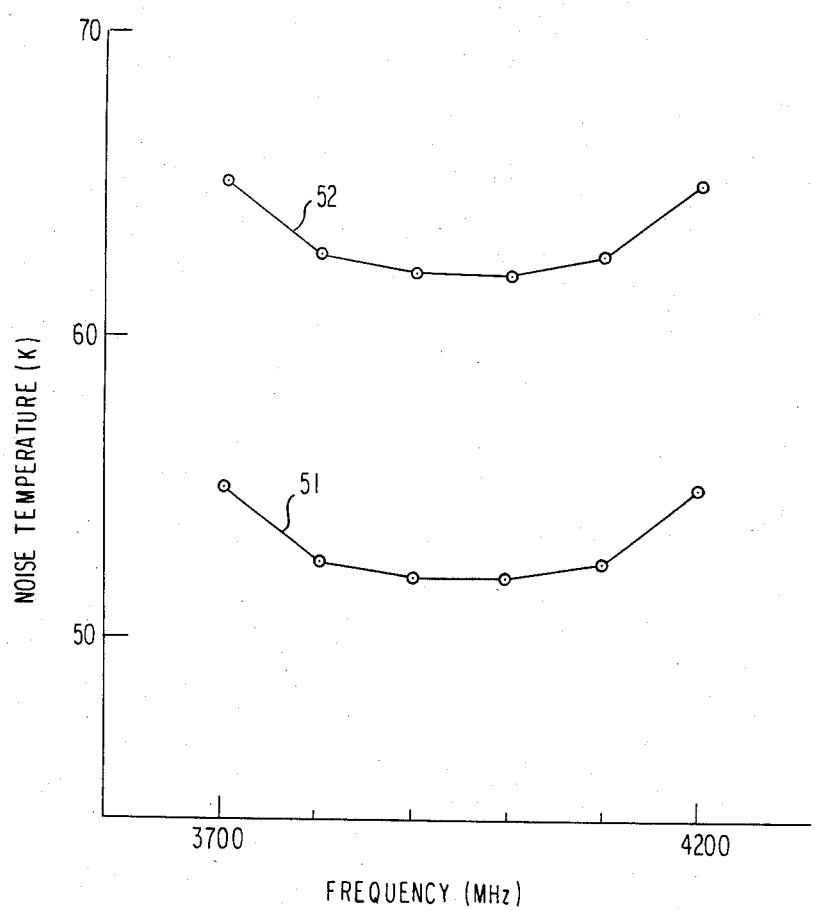
FIG. 5 shows a graphical representation for use in comparing a characteristic of the amplification device illustrated in FIGS. 2 and 3 with that of the conventional amplification device illustrated in FIG. 1.

Referring to FIG. 5, wherein the abscissa and the ordinate represent a frequency (MHz) and a noise temperature (K), respectively, curve 51 shows a characteristic of the amplification device illustrated in FIGS. 2 and 3 while curve 52 shows, a characteristic of the conventional device illustrated in FIG. 1. As readily understood from FIG. 5, the amplification device according to this invention has the noise temperature improved by about 20% in comparison with the conventional device. This is because the amplification device according to this invention has no matching circuit between the output port 22 and the amplifier 14 and can avoid any loss resulting from the matching circuit. Thus, the amplification device can achieve an excellent low noise characteristic and can improve reliability of a system when applied to a receiver for use in satellite communication.

While this invention has thus far been described in conjunction with a preferred embodiment thereof, it will readily be possible for those skilled in the art to put this invention into practice in various other manners. For example, a single extension or two extensions may be placed as the admittance element at a position or positions selected between the input and the output ports 33 and 22, between the output and the dummy ports 22 and 23, and between the dummy and the input ports 23 and 33. The dummy load 24 may be supplied with a bias voltage. The frequency may be in a specified band such as the down link range 5.9–6.4 GHz. The output port 22 of the isolator 21 may be connected direct to the amplifier 14 without the inductance element 34. The isolator 21 may not always be of a Triplate strip line. A capacitance element may be substituted for the inductance element 34.

What is claimed is:

1. An amplification circuit for use in satellite communication and comprising an isolator having an input port for an input signal, an output port for an output signal, and a dummy port connected to a dummy load, an amplifier having an admittance for amplifying said output signal, a conductive housing for accommodating said isolator and said amplifier, and an inductance element between said amplifier and said output port, said isolator comprising an admittance element which is operable to adjust the admittance of said isolator to that of said amplifier in cooperation with said inductance element and which is connected to said isolator at a position elected between said input and said output ports, between said output and said dummy ports, and between said dummy and said input ports whereby said output port is connected directly to said amplifier through said inductance element without any matching circuit for matching said isolator and said amplifier.

2. An amplification circuit as claimed in claim 1, wherein said output port is connected direct to said amplifier.

3. An amplification circuit as claimed in claim 1, wherein said output port is connected through a reactance element to said amplifier.

4. An amplification circuit as claimed in claim 1, wherein said input, said output, and said dummy ports are coplanar together with said admittance element.

5. An amplification circuit as claimed in claim 4, said isolator comprising a strip line conductor which comprises three coplanar branches connected to said input, said output, and said dummy ports, respectively, wherein said admittance element is integral with said branches.

6. An amplification circuit as claimed in claim 5, wherein said admittance element comprises extensions of the respective branches.

7. An amplification circuit as claimed in claim 6, wherein said extensions and said input, said output, and said dummy ports are azimuthally equally spaced apart from one another.

* * * * *

UNITED STATES PATENT AND TRADEMARK OFFICE
CERTIFICATE OF CORRECTION

PATENT NO. : 4,724,399

DATED : February 9, 1988

INVENTOR(S) : AKINAGA

It is certified that error appears in the above-identified patent and that said Letters Patent is hereby corrected as shown below:

COLUMN 3, LINE 63   After "on" delete "admittances"
            insert --admittance--;
                After "The" delete "admittance"
            insert --admittances--.

Signed and Sealed this

Twenty-seventh Day of September, 1988

Attest:

DONALD J. QUIGG

*Attesting Officer*    *Commissioner of Patents and Trademarks*